United States Patent [19]
Byatt

[11] Patent Number: 5,955,750
[45] Date of Patent: Sep. 21, 1999

[54] FOUR-REGION (PNPN) SEMICONDUCTOR DEVICE

[75] Inventor: Stephen W. Byatt, Bromham, United Kingdom

[73] Assignee: Texas Instruments Incorporated, Dallas, Tex.

[21] Appl. No.: 08/521,158

[22] Filed: Aug. 30, 1995

[30]     Foreign Application Priority Data

Aug. 30, 1994 [GB]  United Kingdom ............... 9417393

[51] Int. Cl.⁶ ..................... H01L 29/74; H01L 31/111
[52] U.S. Cl. .................. 257/110; 257/120; 257/173
[58] Field of Search .................. 257/107, 110, 257/111, 120, 132, 173, 174

[56]     References Cited

FOREIGN PATENT DOCUMENTS

| 542 648 | 5/1993 | European Pat. Off. . |
| 552 905 | 7/1993 | European Pat. Off. . |
| 205 685 A2 | 12/1988 | United Kingdom . |
| 208 257 A2 | 3/1989 | United Kingdom . |

*Primary Examiner*—Wael Fahmy
*Attorney, Agent, or Firm*—Richard L. Donaldson; William B. Kempler

[57]     ABSTRACT

A four-region (PNPN) semiconductor device structure that provides greater flexibility in the setting of PN junction breakdown conditions. The four-region (PNPN) semiconductor device includes an additional N-type body at the junction between the inner N-type region and the inner P-type region, the additional N-type body including a first part adjacent to a second part, the first and second parts having different impurity concentrations from one another, both being of high impurity concentration than the inner N-type region and of lower impurity concentration than the inner P-type region.

11 Claims, 1 Drawing Sheet

FOUR-REGION (PNPN) SEMICONDUCTOR DEVICE

The present invention relates to a four-region (PNPN) semiconductor device.

A four-region (PNPN) semiconductor device may be used as a voltage-transient suppressor since the junction between the inner N-type region and the inner P-type region breaks down, in reverse, at a voltage dependent on the conductivities of the regions forming that junction and, following junction breakdown, the device switches to and remains in a low impedance state for as long as the available current exceeds some set value which is the holding current for the device.

An object of the present invention is the provision of a four-region (PNPN) semiconductor device structure that permits greater flexibility in the setting of the breakdown conditions than is possible with existing four-region (PNPN) devices.

The invention provides a four-region (PNPN) semiconductor device including an additional N-type body at the junction between the inner N-type region and the inner P-type region, the additional N-type body including a first part adjacent to a second part, the first and second parts being of different conductivities from one another, both being of higher conductivity than the inner N-type region and of lower conductivity than the inner P-type region.

A two-part structure for the additional N-type body is especially suitable for voltage-transient suppressors capable of handling large surge currents since the current at which switching occurs initially is set by the higher conductivity part of the additional N-type body and can be made significantly lower than the overall surge current capacity of the device, the surge current capacity being determined by other parts of the device. That is, the two-part structure for the additional N-type body provides devices with large surge current capacities while maintaining good sensitivity to overvoltage conditions.

Preferably, the second part of the additional N-type body forms a ring around the first part of the additional N-type body, each part of the additional N-type body having a junction with the inner N-type region.

Preferably, the first part of the additional N-type body is of higher conductivity than the second part.

Preferably, the first part of the additional N-type body is thicker than its second part where thickness is measured in the direction of current flow through the device.

Preferably, the first part of the additional N-type body is established by ion implantation and, preferably, the second part of the additional N-type body is established by ion implantation.

A method of fabricating the semiconductor device may include the steps of implanting the first and second parts of the additional N-type body.

The additional N-type body may include a plurality of first parts separated from one another by the second part, each part of the additional N-type body having a junction with the inner N-type region.

Preferably, in an N-type body with a plurality of first parts, each first part is of higher conductivity than the second part.

In an N-type body with a plurality of first parts, those first parts may be established by ion implantation and the second part of the additional N-type body established by diffusing the second part from the first parts.

A method of fabricating a semiconductor device with a plurality of first parts may include the steps of implanting the first parts and diffusing the second part from the first parts.

Four forms of four-region (PNPN) semiconductor device in accordance with the invention will now be described, by way of example only, with reference to the accompanying drawings in which:

BRIEF DESCRIPTION OF THE DRAWINGS

Referring to FIG. 1 of the accompanying drawings, the first example of a unidirectional four-region (PNPN) semiconductor device represented therein includes a P-type anode region 1 providing a first junction with an N-type substrate region 2, a P-type base region 3 which provides a second junction with the N-type substrate region 2 and an N-type emitter region 4 which provides a third junction with the P-type base region 3.

Figure 1:
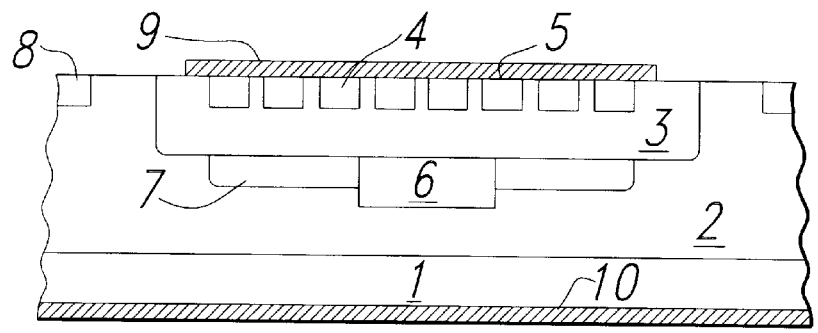
FIG. 1 represents a transverse cross-section of a first example of a unidirectional four-region (PNPN) semiconductor device in accordance with the invention.

An additional N-type body lying in the substrate region 2 consists of a first part 6 that is surrounded by second part 7 and both the first part 6 and the second part 7 lie at the second junction, that is, the junction between the P-type base region 3 and the substrate region 2. The impurity concentration of the first part 6 of the additional N-type body is higher than the impurity concentration of the second part 7 of the additional N-type body. The impurity concentration of the substrate region 2 is lower than the impurity concentration of each part of the additional N-type body 6,7 and the impurity concentration of the P-type base region 3 is higher than the impurity concentration of each part of the additional N-type body 6,7.

The emitter region 4 of the semiconductor device is penetrated at a plurality of locations 5 by the base region 3. A conductive contact layer 9 makes contact with one surface of the emitter region 4 and makes contact with the base region 3 where the base region 3 penetrates the emitter region 4. The four-region (PNPN) semiconductor device includes an N-type channel stopper ring 8 at its upper edge (as viewed in the drawing) and a conductive contact layer 10 on the surface of its anode region 1.

The additional N-type body 6,7 beneath the region 3 defines the breakdown voltage of the device. Ion implantation is relied on to give good control of the breakdown voltage. At voltage breakdown, current passes vertically through the junction of the P-type base region 3 and the additional N-type body 6,7. The current then passes through the P-type base region 3 and out through the locations 5 to the terminal 9. The current flow in the P-type base region 3 causes a voltage drop which eventually forward basses the emitter junction and initiates conduction into the on state. Switching occurs at a critical current density flow through the breakdown junction.

The current surge rating Pfu the four-region (PNPN) device is approximately proportional to the area of its emitter region 4. The device may be made larger to increase the surge rating and the current at which switching occurs may also be expected to increase. The provision of a two-part additional N-type body 6,7 serves to maintain the switching current at a relatively low value set by the size of the first part 6 of the two-part additional N-type body 6,7.

In the four-region (PNPN) device with a two-part additional N-type body 6,7, the switching current is proportional to the size of the first part 6, the part having a higher impurity concentration, of the additional N-type body 6,7.

In the fabrication of the four-region (PNPN) device, the first part 6 of the additional N-type body 6,7 is implanted first using an oxide mask and then the oxide mask is rebut to allow implantation in the second part and also in the first part. This means that the second part 7 of the additional N-type body 6,7 always has a lower impurity concentration than does the first part 6. The switching current is defined by the area of the most highly doped part of the additional N-type body 6,7 and by making the additional N-type body 6,7 substantially the same size as the emitter region 4 of the device there is no reduction in the surge capacity of the device.

Under the influence of a rapidly rising energy surge, the device will begin up break down first in the first part 6 of the additional N-type body 6,7, and the voltage will overshoot due to the series resistance associated wits the small breakdown region. However, as the voltage rises above the breakdown of the second part of the additional N-type body 6,7, the second part 7 starts to break down and both parts of the additional N-type regions 6,7 contribute towards switching on the device. That initiates switching over all of the device area. The device has a switching current dependent on the area of the first part 6 of the additional N-type body 6,7 and a surge current capacity dependent on the whole area of the additional N-type body 6,7 which is substantially equal to the area of its emitter region 4.

If the N-type substrate region 2, the P-type base region 3 and the N-type emitter region 4 are regarded as acting as an NPN transistor, then the gain of the transistor is relatively constant across its width because the additional N-type body is co-extensive with its emitter.

Figure 2:
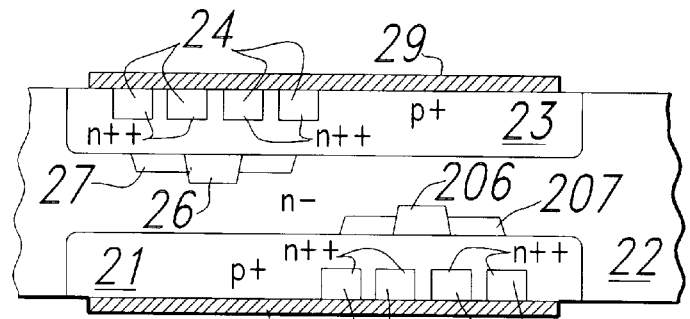
FIG. 2 represents a transverse cross-section of a bisectional four-region (PNPN) semiconductor device in accordance with the invention

Referring to FIG. 2 of the accompanying drawings, a bidirectional four-region (PNPN) semiconductor device in accordance with the invention includes a lightly doped N-type substrate region 22 in which there is a first additional N-type body having a first part 26 and a second part 27, both more doped than the substrate region 22 and the first part 26 being more highly doped than the second part 27, adjacent to a R-type base region 23 which has a junction with a highly doped N-type emitter region 24 which is penetrated at a plurality of locations by the P-type base region 23. A P-type anode region 21 has a junction with the lightly doped N-type substrate region 22. The N-type substrate region 22, the P-type anode region 21, the P-type base region 23, the N-type emitter region 24 and the additional N-type body 26,27 form a first four-region (PNPN) semiconductor device. The N-type substrate 22, the P-type region 23 and the P-type region 21 are shared by a second four-layer (PNPN) semiconductor device for which the P-type region 23 serves as an anode region and the P-type region 21 serves as a base region. The second four-layer (PNPN) semiconductor device includes a second additional N-type body 206,207 in which a first part 206 is more doped than a second part 207 and an N-type emitter region 204 which is penetrated by the P-type region 21 at a plurality of locations, offset from the corresponding elements of the first four-layer (PNPN) device. Terminal contacts 28 and 29 complete the devices.

Figure 3:
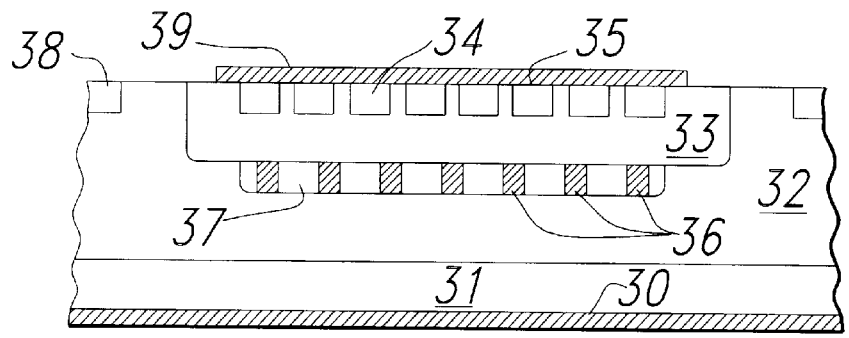
FIG. 3 represents a transverse cross-section of a second example of a unidirectional four-region (PNPN) device in accordance with the invention and FIG. 4 represents a transverse cross-section of a unidirectional four-region (PNPN) semiconductor device in accordance with the invention incorporating a parallel diode.

Referring to FIG. 3 of the accompanying drawings, the second example of a unidirectional four-region (PNPN) device represented therein includes a P-type anode region 31 providing a first junction with an N-type substrate region 32, a P-type base region 33 which provides a second junction with the N-type substrate region 32 and an N-type emitter region 34 which provides a third junction with the P-type base region 33. So far, the device is the same as the first example of a unidirectional four-region (PNPN) device shown in FIG. 1.

The device shown in FIG. 3 includes an additional N-type body lying in the substrate region 32 and consisting of a plurality of first parts 36 and a second part 37. The first parts 36 and the second part 37 lie at the second junction, that is, the junction between the P-type base region 33 and the substrate region 32. The impurity concentrations of the first parts 36 of the additional N-type body are higher than the impurity concentration of the second part 37 of the additional N-type body. The impurity concentration of the substrate region 32 is lower than the impurity concentration of each part of the additional N-type body 36,37 and the impurity concentration of the P-type base region 33 is higher than the impurity concentration of each part of the additional N-type body 36,37.

The plurality of first parts 36 of the additional N-type body are implanted as a plurality of "dots" and the second part 37 is formed by diffusing impurities from the first parts 36 until the diffused regions merge.

The emitter region 34 of the device shown in FIG. 3 is penetrated at a plurality of locations 35 by the base region 33. A conductive contact layer 39 makes contact with one surface of the emitter region 34 and makes contact with the base region 33 where that region penetrates the emitter region 44. The four-region (PNPN) semiconductor device includes an N-channel stopper ring 38 at its upper edge (as viewed in the drawing) and a conductive layer 30 on the surface of its anode region 31.

Figure 4:
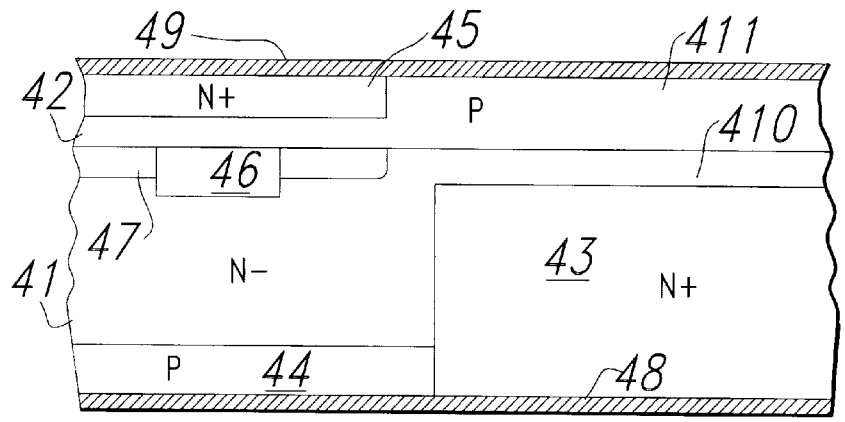

Referring to FIG. 4 of the accompanying drawings, a unidirectional four-region (PNPN) semiconductor device shares a substrate region 41,410 and a P-type region 42,411 with a PN diode. The four-region (PNPN) device includes a P-type anode region 44 forming a first junction with the part 41 of the N-type substrate region 41,410, an additional N-type body 46,47 in the part 41 of the N-type substrate region 41,410, the part 42 of the P-type region 42,411 and an N-type emitter region 45 which is not penetrated by the adjacent P-type region 42. The PN diode includes the part 410 of the N-type substrate region 41,410 and the part 411 of the P-type region 42,411. The part 410 of the N-type substrate region 41,410 is of reduced thickness compared with the part 41 of that region, the reduction in thickness being effected by a highly doped N-type region 43. Terminal contacts 48,49 complete the device.

The effects of the additional N-type bodies included in a device represented by FIG. 2 or by FIG. 3 or by FIG. 4 on those devices are substantially the same as the effects of the additional N-type body included in a device represented by FIG. 1 on that device.

The penetration of the N-type emitter regions, in a device represented by FIG. 1 or FIG. 2 or FIG. 3, by the adjacent P-type region provides a means of controlling the holding current of the device and is not an essential feature of the device.

I claim:

1. A four-region (PNPN) semiconductor device including an additional N-type body at a junction between an inner N-type region and an inner P-type region, the additional N-type body including a first part adjacent to a second part, the first and second parts having different impurity concentrations from one another, both having a higher impurity concentration than the inner N-type region and a lower impurity concentration than the inner P-type region.

2. A device as claimed in claim 1, wherein the second part of the additional N-type body forms a ring around the first part of the additional N-type body, each part of the additional N-type body having a junction with the inner N-type region.

3. A device as claimed in claim 1, wherein the first part of the additional N-type body has a higher impurity concentration than the second part.

4. A device as claimed in claim 1, wherein the first part of the additional N-type body is thicker than the second part where thickness is measured in the direction of current flow through the device.

5. A device as claimed in claim 1, wherein the first part of the additional N-type body is formed by ion implantation.

6. A device as claimed in claim 1, wherein the second part of the additional N-type body is formed by ion implantation.

7. A device as claimed in claim 1, wherein the additional N-type body includes a plurality of first parts within the second part, each part of the additional N-type body having a junction with the inner N-type region.

8. A device as claimed in claim 7, wherein each first part of the additional N-type body has a higher impurity concentration than the second part.

9. A device as claimed in claim 1, wherein the first part of the additional N-type body is formed by ion implantation and a portion of diffused impurities from the first part forms the second part.

10. A method of fabricating a semiconductor device as claimed in claim 1 including the steps of implanting the first and second parts of the additional N-type body.

11. A method of fabricating a semiconductor device a claimed in claim 1 wherein the semiconductor device has a plurality of first parts and including the steps of implanting the plurality of first parts of the additional N-type body and diffusing the second part from the implanted first parts.

* * * * *